(12) United States Patent
Chan et al.

(10) Patent No.: US 8,599,963 B2
(45) Date of Patent: *Dec. 3, 2013

(54) METHOD AND APPARATUS FOR OPTIMIZING TRANSMITTER POWER EFFICIENCY

(75) Inventors: Wen Yen Chan, Thornhill (CA); Xin Jin, Ottawa (CA); Qing Zhong Jiao, Ottawa (CA)

(73) Assignee: BlackBerry Limited, Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/325,895

(22) Filed: Dec. 14, 2011

(65) Prior Publication Data

US 2012/0087441 A1    Apr. 12, 2012

Related U.S. Application Data

(63) Continuation of application No. 12/942,757, filed on Nov. 9, 2010, now Pat. No. 8,098,761, which is a continuation of application No. 12/276,650, filed on Nov. 24, 2008, now Pat. No. 7,852,968, which is a continuation of application No. 10/724,951, filed on Dec. 1, 2003, now Pat. No. 7,471,738.

(60) Provisional application No. 60/430,293, filed on Dec. 2, 2002.

(51) Int. Cl.
*H04L 25/49* (2006.01)

(52) U.S. Cl.
USPC .......................................................... 375/297

(58) Field of Classification Search
USPC .............. 375/295, 296, 297; 455/114.3, 273, 455/278, 296, 127
See application file for complete search history.

(56) References Cited

U.S. PATENT DOCUMENTS

| | | | |
|---|---|---|---|
| 4,849,711 A | 7/1989 | Leis et al. | |
| 6,043,707 A | 3/2000 | Budnik | |
| 6,166,598 A | 12/2000 | Schlueter | |
| 6,205,127 B1 | 3/2001 | Ramesh | |
| 6,349,216 B1 * | 2/2002 | Alberth et al. | 455/550.1 |
| 6,535,066 B1 | 3/2003 | Petsko | |
| 6,597,925 B1 | 7/2003 | Garcia et al. | |
| 6,765,440 B2 | 7/2004 | Chandrasekaran | |
| 6,862,457 B1 | 3/2005 | Sarkar et al. | |
| 6,891,902 B2 * | 5/2005 | Talwar et al. | 375/296 |
| 6,898,257 B2 * | 5/2005 | Fischer et al. | 375/376 |
| 6,965,676 B1 | 11/2005 | Allred | |
| 6,985,704 B2 * | 1/2006 | Yang et al. | 455/126 |
| 2002/0080887 A1 | 6/2002 | Jeong et al. | |

(Continued)

*Primary Examiner* — Khanh C Tran
(74) *Attorney, Agent, or Firm* — Moffat & Co.

(57) ABSTRACT

A peak to average power ratio signal is generated from a first mapping function that selects the peak to average power ratio signal that corresponds to the data rate or data format of the signal to be transmitted. The selected peak to average power ratio signal is summed with a desired average transmit power signal. The resulting summation signal is input to a second effectively continuously valued mapping function comprising a table that has a plurality of power amplifier control signal values each with a corresponding peak transmit power. Each peak transmit power signal value results in a power amplifier control signal value that achieves the best possible transmitter power efficiency while still meeting out of band spurious emissions and waveform quality requirements. The summation signal value maps to one of the power amplifier control signal value that is then used to adjust a parameter such as bias of the power amplifier.

2 Claims, 5 Drawing Sheets

(56) References Cited

U.S. PATENT DOCUMENTS

| | | |
|---|---|---|
| 2002/0159503 A1 | 10/2002 | Ramachandran |
| 2003/0036361 A1 | 2/2003 | Kawai et al. |
| 2003/0060193 A1 | 3/2003 | Kurita |
| 2003/0086398 A1 | 5/2003 | Hiltunen |
| 2003/0176202 A1 | 9/2003 | Bartl et al. |
| 2003/0222819 A1 | 12/2003 | Karr et al. |
| 2004/0100921 A1 | 5/2004 | Khan |
| 2004/0251962 A1 | 12/2004 | Rosnell et al. |
| 2006/0046658 A1 | 3/2006 | Cruz et al. |
| 2006/0140296 A1* | 6/2006 | Cleveland et al. ............ 375/260 |

* cited by examiner

METHOD AND APPARATUS FOR OPTIMIZING TRANSMITTER POWER EFFICIENCY

RELATED APPLICATIONS

The present application is a continuation of U.S. application Ser. No. 12/942,757, filed Nov. 9, 2010, which is a continuation of U.S. Pat. No. 7,852,968, issued Dec. 14, 2010, which is a continuation of U.S. Pat. No. 7,471,738, issued Dec. 30, 2008, and claiming priority from U.S. provisional application Ser. No. 60/430293 filed on Dec. 2, 2002, the complete drawings and specification of all of which are incorporated herein by reference.

FIELD OF TECHNOLOGY

The present invention relates to transmitter power efficiency in communication systems and in particular to optimizing transmitter power efficiency in communication systems.

BACKGROUND TO THE INVENTION

Mobile electronic devices, such as radios and cellular telephones, typically rely on power from one or more internal batteries. A major performance criterion for such devices is the battery life, which is typically defined as the time period for which the battery will power the device on a single charge. A large portion of the battery power is consumed in a power amplifier (PA) section of the mobile electronic device's transmitter. The power amplifier section amplifies the power of a signal to be transmitted from a comparatively low internal power level to a substantially higher power level required for wireless communication with remote base stations or other devices.

Power efficiency is even more important with multimedia services that consume significantly more power than traditional voice communication services. Thus, improving the power amplifier efficiency or, more generally, transmitter efficiency, is an important factor in battery life performance.

One of the main difficulties in extending battery life is related to the modulation schemes now being used. Modulation methods such as code division multiple access (CDMA), orthogonal frequency division multiplexing (OFDM), and other types of multi-carrier modulations exhibit high peak-to-average power ratios (PAPR). Further complicating the problem is the stochastic nature of the required transmitter power. These transmitters are required to provide both large dynamic range and good linearity. In addition, some standards require quick variation in both output power and PAPR. For example, air interface standard CDMA2000 requires provisioning for variations of up to 800 dB per second.

Current transmitters are designed for peak power utilization. Thus, at low power utilization, the power efficiency is lower than at peak power utilization. There is a resulting need in the art for a way to optimize transmitter power efficiency.

SUMMARY OF THE INVENTION

The present invention includes a method and apparatus for a transmitter that has an encoder and modulator for generating an encoded and modulated transmit signal from a digital input signal. The digital input signal may be a digital representation of a speech signal, a computer data signal, or some other type of digital signal as is known to those skilled in the art.

A digital to analog converter generates an analog representation signal of the encoded and modulated transmit signal. A mapping function selects an effectively continuous control signal value in response to a desired average power output signal. The mapping function comprises a table that has a plurality of control signal values that are effectively continuous in a range, each corresponding to a desired transmitter power, for controlling at least one device with the transmitter. The selected control signal value is used to adjust the at least one device within the transmitter.

The present invention therefore provides a transmitter apparatus comprising: an encoder and modulator that generates an encoded and modulated transmit signal from an input signal; a digital to analog converter, coupled to the encoder and modulator, for generating an analog representation signal of the encoded and modulated transmit signal; an effectively continuously valued mapping function that selects an output value for a power amplifier control signal in response to a desired transmit power signal, the effectively continuously valued mapping function comprising a table having a plurality of output values for the power amplifier control signals each with a corresponding desired transmit power value; and a power amplifier coupled to the analog representation signal and the power amplifier control signal, at least one parameter within the power amplifier being adjusted in response to the power amplifier control signal.

The present invention further provides a transmitter apparatus in a wireless mobile device, the apparatus comprising: an encoder and modulator that generates an encoded and modulated transmit signal from an input signal, and generates a data indicator signal corresponding to the type of encoded and modulated transmit signal; a digital to analog converter, coupled to the encoder and modulator, for generating an analog representation signal of the encoded and modulated transmit signal; a first mapping function, coupled to the encoder and modulator, that generates a peak to average power ratio signal in response to the data indicator signal; a summer that generates a peak transmit power signal by summing the peak to average power ratio signal and a desired average transmit power signal; a second mapping function that generates an effectively continuously valued power amplifier control signal in response to the peak transmit power signal, the second mapping function comprising a table having a plurality of power amplifier control signal values each corresponding to a peak transmit power value; an automatic gain control amplifier, coupled to the digital to analog converter, for generating an amplified analog representation signal in response to the desired average transmit power signal; and a power amplifier with an input port coupled to the amplified analog representation signal and a control port coupled to the power amplifier control signal, at least one parameter of the power amplifier being adjusted in response to the power amplifier control signal such that the amplified analog representation signal is transmitted at an desired power value with optimized power efficiency while still meeting out of band spurious emissions and waveform quality requirements.

The present invention still further provides a transmitter apparatus in a wireless mobile device, the apparatus comprising: an encoder and modulator that generates an encoded and modulated transmit signal from an input signal, and generates a data indicator signal corresponding to the type of encoded and modulated transmit signal; a digital to analog converter, coupled to the encoder and modulator, for generating an analog representation signal of the encoded and modulated transmit signal; a first mapping function, coupled to the encoder and modulator, that generates a peak to average power ratio signal in response to the data indicator signal; a desired power indicator generator that generates a desired average transmit power signal in response to an open loop power control signal and a closed loop power control signal; a summer that generates a peak transmit power signal by summing the peak to average power ratio signal and the desired average transmit power signal; a second mapping function that generates an effectively continuously valued power amplifier control signal in response to the peak transmit power signal, the second mapping function comprising a table having a plurality of power amplifier control signal values each corresponding to a peak transmit power value; an automatic gain control amplifier, coupled to the digital to analog converter, for generating an amplified analog representation signal in response to the desired average transmit power signal; and a power amplifier with an input port coupled to the amplified analog representation signal and a control port coupled to the power amplifier control signal, at least one parameter of the power amplifier being adjusted in response to the power amplifier control signal such that the amplified analog representation signal is transmitted at the desired power value with optimized power efficiency while still meeting out of band spurious emissions and waveform quality requirements.

The present invention still further provides a transmitter apparatus comprising: an encoder and modulator that generates an encoded and modulated transmit signal from an input signal; a digital to analog converter, coupled to the encoder and modulator, for generating an analog representation signal of the encoded and modulated transmit signal; a plurality of mapping functions that each select an effectively continuously valued control signal for at least one device within the transmitter apparatus in response to a desired transmit power signal, the plurality of mapping functions each comprising a table having a plurality of control signal values each with a corresponding desired transmit power value; and at least one device within the transmitter having a plurality of control ports input, each control port input coupled to a mapping function of the plurality of mapping functions such that at least one parameter of the transmitter apparatus is adjusted in response to at least one of the plurality of control signals.

The present invention further provides a method for optimizing transmitter power efficiency in a transmitter apparatus, the method comprising: generating an encoded and modulated signal from a digital input signal; converting the encoded and modulated signal into an analog transmit signal; generating a desired transmit power level value; and continuously mapping the desired transmit power level value to a control signal value for at least one device within the transmitter apparatus to achieve an optimized transmitter power efficiency, wherein each transmit power level results in the optimized transmitter power efficiency while still meeting out of band spurious emissions and waveform quality requirements.

The present invention still further provides a method for optimizing transmitter power efficiency in a transmitter apparatus, the method comprising: generating an encoded and modulated signal from a digital input signal and also generating a data indicator signal corresponding to the encoded and modulated signal; converting the encoded and modulated signal into an analog transmit signal; selecting, in response to the data indicator signal, an output peak to average power ratio signal value from an array of peak to average power ratio signal values each having a corresponding data rate or data format; generating a desired transmit power level signal value; summing the desired transmit power level signal value and peak to average power ratio signal value to generate a peak transmit power level signal value; and continuously mapping the value of the peak transmit power level signal to a value of a at least one control signal for at least one device within said transmitter apparatus that controls at least one parameter within said transmitter apparatus to achieve an optimized power efficiency of the transmitter apparatus, wherein each transmit power level results in the optimized transmitter power efficiency while still meeting out of band spurious emissions and waveform quality requirements.

The present invention further provides a mobile device comprising: a controller that controls operation of the mobile device; a transmitter apparatus comprising: an encoder and modulator that generates an encoded and modulated transmit signal from an input signal; a digital to analog converter, coupled to the encoder and modulator, for generating an analog representation signal of the encoded and modulated transmit signal; a mapping function that selects an effectively continuously valued output value for a power amplifier control signal in response to a desired transmit power signal, the effectively continuously valued mapping function comprising a table having a plurality of output values for the power amplifier control signals each with a corresponding desired transmit power value; and a power amplifier coupled to the analog representation signal and the power amplifier control signal, at least one parameter within the power amplifier being adjusted in response to the power amplifier control signal.

BRIEF DESCRIPTION OF THE DRAWINGS

The present invention will be better understood with reference to the drawings, in which.

DETAILED DESCRIPTION

The embodiments of the transmitter power optimization of the present invention provide a way to improve power efficiency of transmitters having varying transmit power and high PAPR. The transmitter circuits control various circuit parameters that are adjusted continuously to optimize power efficiency. These parameters can include, but are not limit to, dynamic range, gain, bias, conduction angle, power supply voltage, a stage switch-in feature, a stage switch-out feature, number of amplifying stages, a turning on feature, a turning off feature, a charging duty cycle, an amplifier class change feature, a load, or an impedance.

Figure 1:
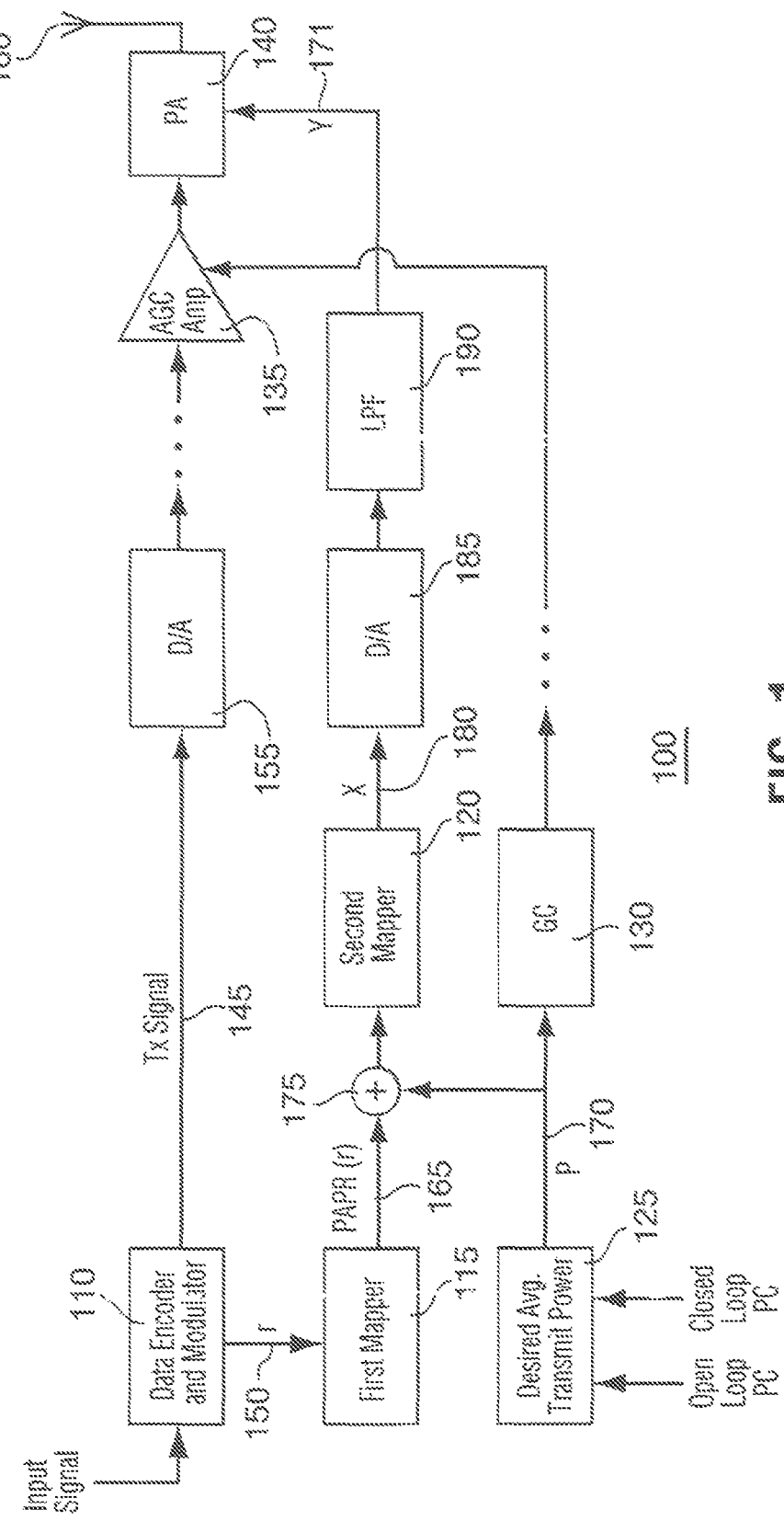
FIG. 1 shows a simplified block diagram of one embodiment of a transmitter apparatus in accordance with the present invention.

Reference is now made to the drawings. FIG. 1 illustrates a simplified block diagram of a transmitter apparatus 100 in accordance with the present invention. The transmitter 100 comprises a data encoder and modulator 110. The data encoder and modulator 110 converts a digital signal to be transmitted to the modulation technique appropriate to the air interface standard in which the mobile is operating. In one embodiment, the data encoder and modulator 110 uses CDMA modulation for use in an IS-2000 system. Other modulation schemes may include UMTS, 802.11, GSM, EDGE, TDMA, or others that are well known to those skilled in the art.

The data encoder and modulator 110 generates a Tx signal 145 and a data format/data rate indicator that uniquely indicates a supported combination of data rate, coding and modulation method of the wireless mobile device, referred to herein as a data indicator "r" 150. The Tx signal 145 comprises data frames to be transmitted at variable data formats or data rates. The data indicator "r" 150 indicates the variable data rate and format at which the signal is being transmitted.

The digital Tx signal 145 is converted to an analog signal by a digital-to-analog converter 155 prior to performing analog processing. Analog processing can include mixing to an intermediate frequency and filtering as well as any other necessary analog processes. In some embodiments, zero IF is used and mixing to an intermediate frequency is not required. Analog processing is well known in the art and is not discussed further.

The amplitude of the analog processed signal is adjusted by an automatic gain control (AGC) amplifier 135. Control of the AGC amplifier 135 is discussed subsequently. The signal can then be converted from an intermediate frequency signal (or zero intermediate frequency signal) to an RF frequency for transmission. Alternatively the frequency conversion to an RF frequency is done before the AGC amplifier 135. Either way, the RF signal is input to an RF power amplifier 140 before being transmitted over the air interface by the antenna 160. Control of the power amplifier 140 bias is also discussed subsequently.

The data indicator "r" 150 is mapped by the first mapper 115 to generate signal PAPR(r). This is the ratio of the peak signal power over the average signal power of signal 145 that corresponds to the data indicator "r" 150. This peak to average power ratio signal is designated as PAPR(r) 165. In one embodiment, PAPR(r) is in dB or proportional to dB.

A desired average transmit power block 125 generates a desired average power indicator "p" 170. This block 125 uses an open loop power control method, a closed loop power control correction signal from the base station (preferably transmitted every 1.25 ms), and/or other base station parameters for the offset of power.

With open loop power control, the mobile device preferably uses the received total and pilot signal strengths and internal algorithms to estimate and adjust its own transmit power. The open loop powers can further be adjusted, on a continuous basis, by the closed loop power control commands that the mobile device receives from the base station. These power control signals and methods are well known in the art and are not discussed further.

Since the power control of the mobile device varies with time, the desired average transmit power indicator "p" 170 varies with time. In one embodiment, such as a cdma2000 mobile device, "p" has units of dBm and is updated at the same rate as the closed loop power control (e.g., 1.25 ms). PAPR(r) 165 and "p" 170 are summed by a summer 175 that generates a peak power value in dBm (or proportional to it) representing the peak transmit power of the Tx signal expected at antenna 160, which is the RF counterpart of baseband Tx signal 145.

This peak transmit power is mapped by the second mapper 120 to an effectively continuous "X" signal 180, whose value is effectively continuous in a range that is designed for. The generation of X 180 is as follows: for a given peak Tx power value, p+PAPR(r), determine the corresponding optimal X signal 180 that gives the best transmitter power efficiency while still meeting the out of band spurious emissions and rho (waveform quality) requirements. An array of such values for the X signal 180 is stored in the second mapper 120. In one embodiment, this relationship is non-linear. Interpolation may be used in the mapping to get fine resolution and save storage memory. The array of such values for a transmitter is determined by experimentation during calibration and testing of the transmitter.

The "X" signal 180 is converted to an analog signal by a D/A converter 185 and smoothed by a low pass filter LPF 190. The output of the LPF 190 is used to adjust a setting of the power amplifier 140. The setting in this embodiment is a bias voltage. The bias voltage "Y" is supplied to the power amplifier 140 control input port and is lowered or raised accordingly for optimal power efficiency in generating the power of the transmitted signal Tx 145 and its radio frequency counterpart 160.

The indicator "p" 170 is also input to a gain control block 130 to generate a control signal that controls the Tx signal's gain with the AGC amplifier 135. The AGC control is well known in the art and is not discussed further.

The delay of the Tx signal 145 to the output of antenna 160 is designed to be the same as the delay from "p" 170 or "r" 150 to the effects of "Y" 171 at antenna 160. These identical signal delays are referred to in the art as being delay aligned.

Figure 2:
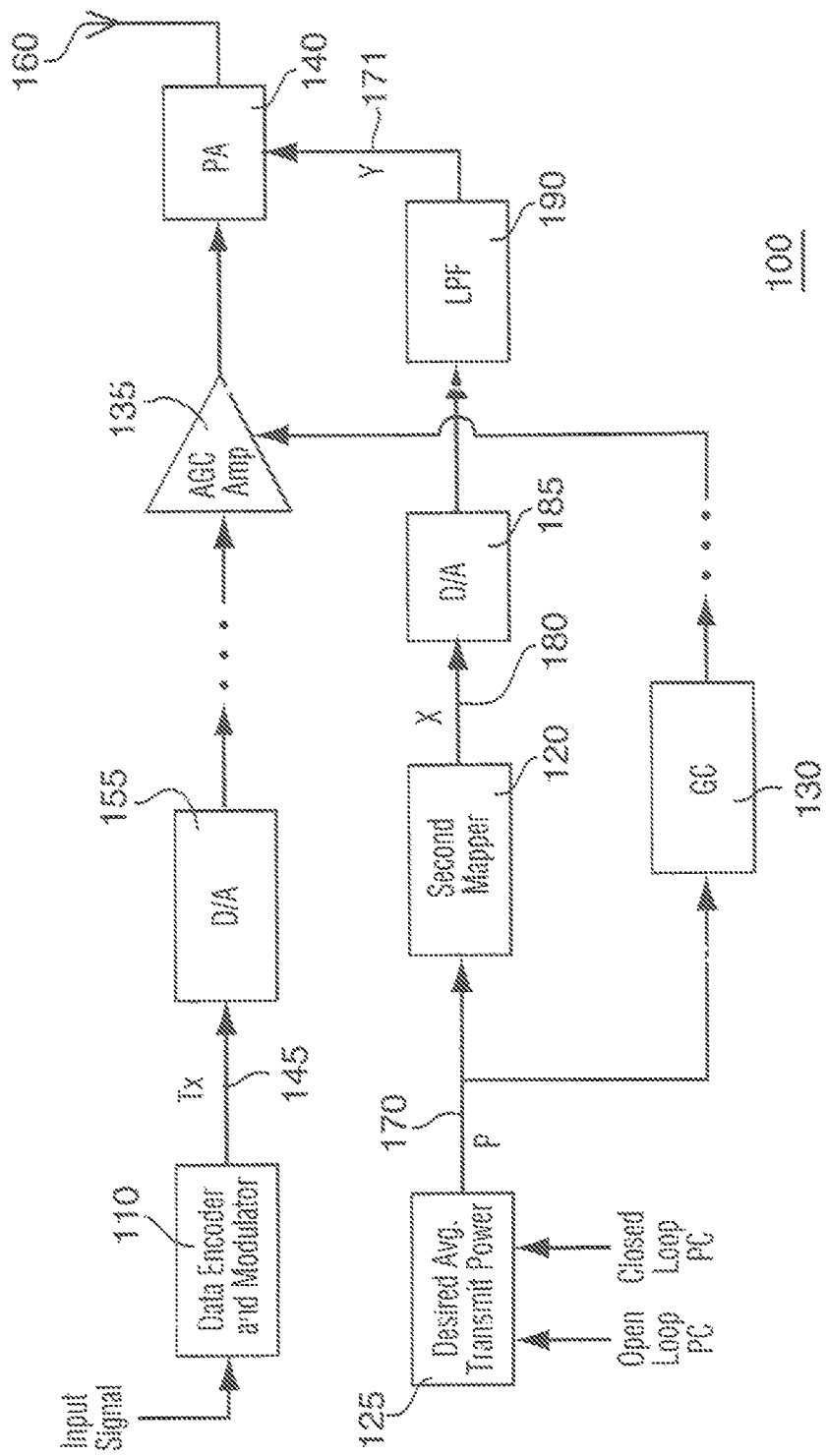
FIG. 2 shows a simplified block diagram of an alternate embodiment of the transmitter apparatus of the present invention.

FIG. 2 illustrates an alternate embodiment of the transmitter apparatus 100 of the present invention. In this embodiment, the first mapper 115 and the summer 175 of the embodiment of FIG. 1 are eliminated. The second mapper 120, with adjustments to its stored array, uses the average transmit power indicator "p" 170 as its input. In this case, the "X" signal 180 is determined as follows: for a given average transmit power indicator "p" 170, the corresponding optimal "X" signal 180 is generated that provides the best transmitter power efficiency while satisfying out of band spurious emissions and rho requirements. As in the previous embodiment, these signals that are stored in the second mapper's 120 array are determined by experimentation. The remainder of the embodiment of FIG. 2 is the same as the embodiment of FIG. 1 and is not discussed further.

Figure 3:
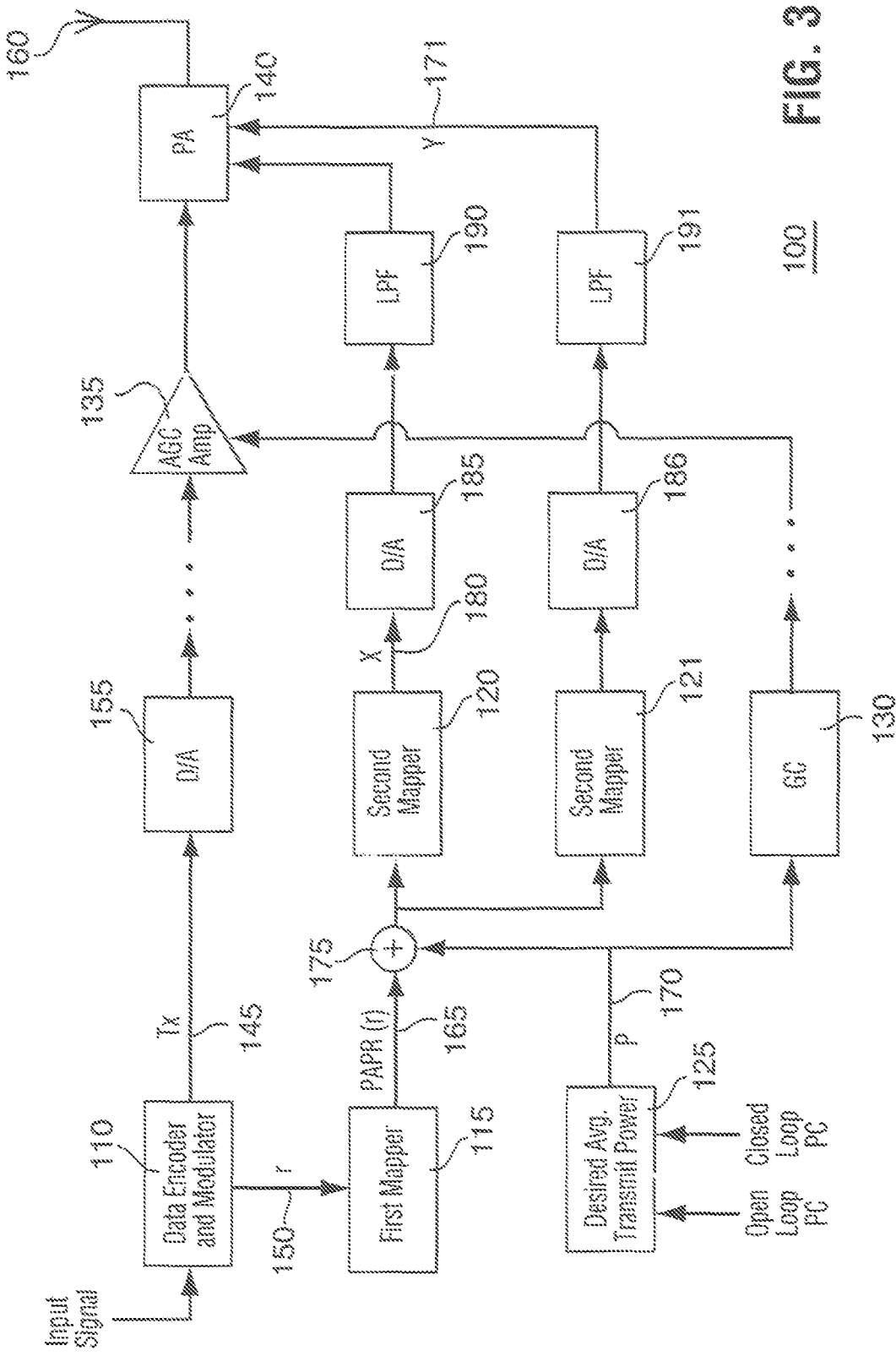
FIG. 3 shows a simplified block diagram of yet another embodiment of the transmitter apparatus of the present invention.

FIG. 3 illustrates yet another embodiment of the transmitter apparatus 100 of the present invention. This embodiment uses multiple "X" signals that are provided to adjust multiple parts of the transmitter 100 or multiple parameters of the same part of the transmitter 100, instead of just one "X" signal 180 to adjust only one parameter of the power amplifier 140. The multiple "X" signals may be implemented by an array of second mappers 120 and 121, D/A converters 185 and 186, and low pass filters 190 and 191. Each individual element of "X" is determined as described in the above embodiment: to provide the best transmitter power efficiency while still satisfying out of band spurious emissions and rho requirements.

In the degenerate case where some elements of "X" signals are digital valued (High or Low), the corresponding mapper may be implemented as a threshold comparator. The multiple "X" signals may also include additional input variables such as the transmitter temperature and battery voltage. The second mapper 120 then becomes multidimensional. Various simplified implementations (or approximations) of multidimensional mapping tables may also be used.

The block diagram of FIG. 3 shows only 2 second mapper functions 120 and 121. However, the present invention is not limited to any one quantity of second mappers. Further, the present invention is not meant to be limited to X being an input to the power amplifier 140, but instead can be used within other parts of transmitter 100.

Figure 4:
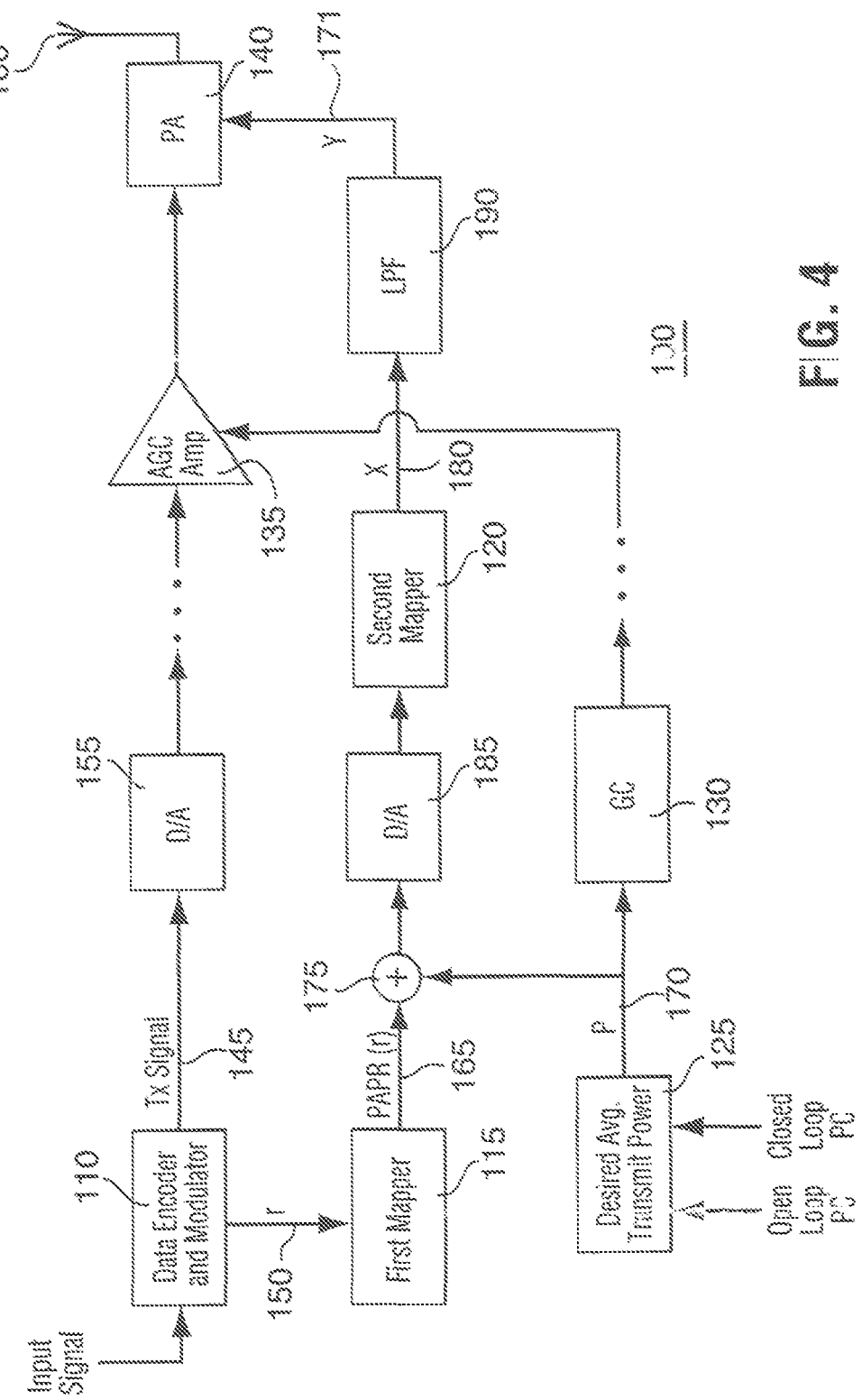
FIG. 4 shows a simplified block diagram of still another embodiment of the transmitter apparatus of the present invention.

FIG. 4 illustrates yet another embodiment of the transmitter apparatus 100 of the present invention. Alternatively, the second mapper 120 may also be implemented by analog means and placed after the D/A converter 185. The functionality of the blocks remains the same as does the remainder of the transmitter, only the implementation of the second mapper 120 has been changed.

Figure 5:
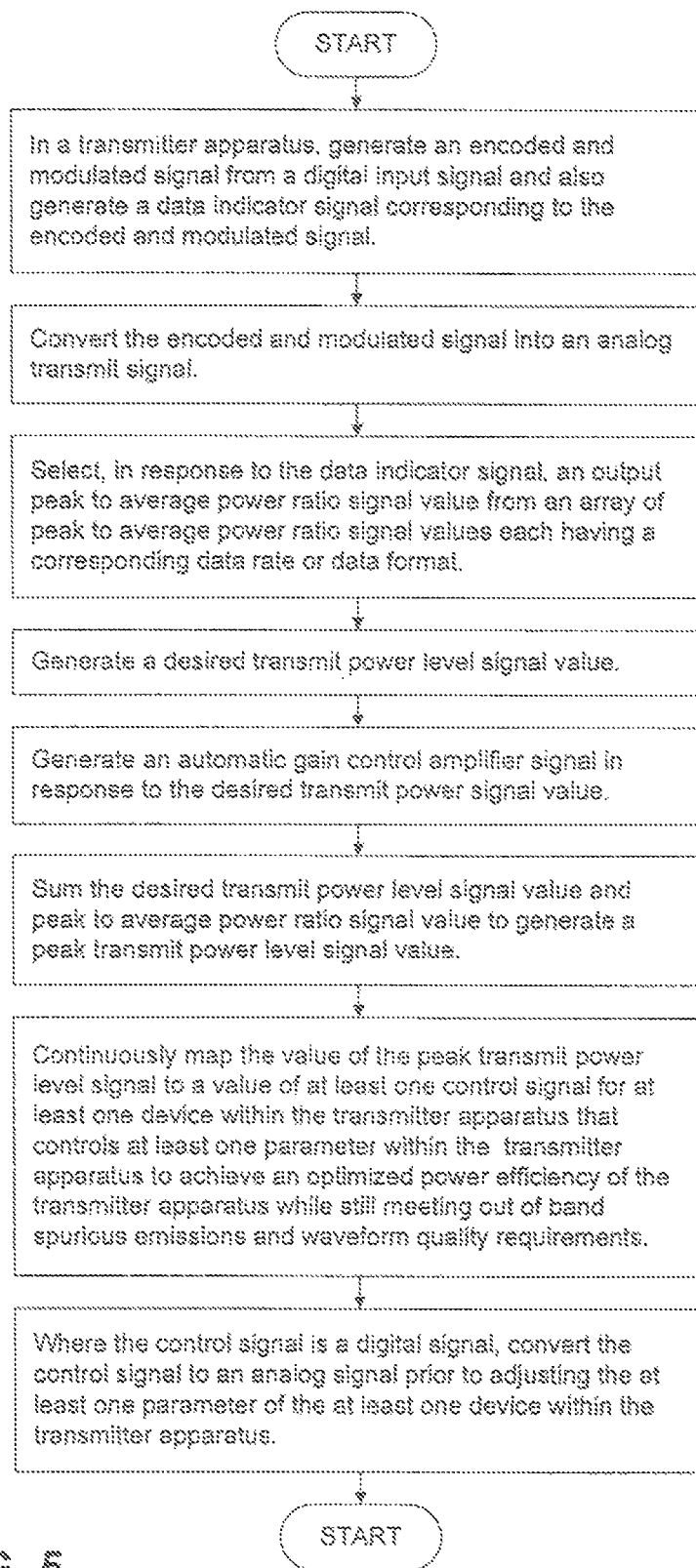
FIG. 5 shows a flow chart of one embodiment of a method in accordance with the present invention.

FIG. 5 illustrates a method for optimizing power efficiency in a transmitter apparatus in accordance with the present invention.

In other embodiments, signals X may control various devices within the transmitter, including a power amplifier, a stage or stages of a power amplifier, a drive amplifier, an AGC amplifier, a power supply to a power amplifier and/or other devices in a transmitter, a mixer, a matching network, a filtering means, a power combining or coupling means, a charging means, a voltage or current generation or regulation means, or other means, or a combination of these.

In still other embodiments, inputs such as the multiple X signals, to control certain transmitter circuit parameters may include (but are not limited to): (a) bias to each or some of the amplifying devices inside a power amplifier so that only the minimum bias is provided to obtain the required out of band spurious emissions and rho for each given transmitted power and/or PAPR values in the supported range; (b) power supply voltage(s) to all or selected stages of the power amplifier 140 and/or other circuits in the transmitter 100; such power supply voltages are supplied to the circuits so that only the minimum voltage is provided to obtain the required out of band spurious emissions and rho for each given transmitted power and/or PAPR values in the supported range; (c) to switch in or out, or turn on or off selected stages according to the transmitted power and/or PAPR values; and (d) gains of all or selected stages of the amplifying chains in the transmitter; (e) conducting angle of all or selected stages of the amplifying chains in the transmitter; (f) class of amplifying (e.g., Class A, AB, C, D, . . . ) of all or selected stages of the amplifying chains in the transmitter; (g) load or impedance of all or selected stages of the amplifying chains in the transmitter; (h) a gain distribution; or (i) any combination of (a), (b), (c), (d), (e), (f), (g) and (h).

In summary, the transmitter apparatus and power optimization method of the present invention provides improved power efficiency of transmitters having varying transmit power and high/variable PAPR. This provides a mobile, battery-powered device with increased battery life performance.

Having described in detail the preferred embodiments of the present invention, including the preferred methods of operation, it is to be understood that this operation could be carried out with different elements and steps. This preferred embodiment is presented only by way of example and is not meant to limit the scope of the present invention. This written description may enable those skilled in the art to make and use embodiments having alternative elements that likewise correspond to the elements of the invention. The intended scope of the invention thus includes other structures, systems or methods that do not differ from the literal language of the description, and further includes other structures, systems or methods with insubstantial differences from the literal language of the description.

What is claimed is:

1. A transmitter apparatus comprising:
   a data encoder and modulator for generating a radio frequency signal from an input signal;
   a first mapping function for selecting a peak to average power ratio, the peak to average power ratio based on a type of the encoded and modulated radio frequency signal generated by the encoder and modulator;
   a second mapping function configured to select an output value for a power amplifier control signal, the output value being selected based on a desired average transmit power level value and the peak to average power ratio; and
   a power amplifier coupled to the radio frequency signal and the power amplifier control signal, at least one parameter within the power amplifier being adjusted in response to the power amplifier control signal.

2. A method within a transmitter apparatus comprising:
   generating a radio frequency signal at a data encoder and modulator from an input signal;
   seleceting, at a first mapping function, a peak to average power ratio based on a type of the encoded and modulated radio frequency signal generated by the encoder and modulator;
   selecting, at a second mapping function with the transmitter apparatus, an output value for a power amplifier control signal, the selecting of the output value being based on a desired average transmit power level value and the peak to average power ratio; and
   adjusting at least one parameter within a power amplifier of the transmitter apparatus, for amplifying the radio frequency signal in response to the power amplifier control signal.

* * * * *